(12) United States Patent
Bushnaq et al.

(10) Patent No.: US 9,773,555 B2
(45) Date of Patent: Sep. 26, 2017

(54) SEMICONDUCTOR MEMORY DEVICE

(71) Applicant: Toshiba Memory Corporation, Tokyo (JP)

(72) Inventors: Sanad Bushnaq, Yokohama Kanagawa (JP); Masanobu Shirakawa, Chigasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/055,296

(22) Filed: Feb. 26, 2016

(65) Prior Publication Data

US 2016/0267983 A1 Sep. 15, 2016

(30) Foreign Application Priority Data

Mar. 12, 2015 (JP) .................................. 2015-049994

(51) Int. Cl.
| | | |
|---|---|---|
| G11C 11/34 | (2006.01) |
| G11C 16/06 | (2006.01) |
| G11C 8/08 | (2006.01) |
| G11C 8/12 | (2006.01) |
| G11C 16/04 | (2006.01) |
| G11C 16/08 | (2006.01) |

(52) U.S. Cl.
CPC ............ G11C 16/06 (2013.01); G11C 8/08 (2013.01); G11C 8/12 (2013.01); G11C 16/0483 (2013.01); G11C 16/08 (2013.01)

(58) Field of Classification Search
CPC .. G11C 16/06; G11C 8/08; G11C 8/12; G11C 16/0483; G11C 16/08

USPC .................................. 365/185.11, 189.08, 63
See application file for complete search history.

(56) References Cited

U.S. PATENT DOCUMENTS

| | | | |
|---|---|---|---|
| 5,875,148 A * | 2/1999 | Tanaka .................... | G11C 8/08 257/E21.659 |
| 7,936,004 B2 | 5/2011 | Kito et al. | |
| 2003/0095448 A1* | 5/2003 | Ichige .................... | G11C 16/04 365/200 |
| 2006/0158932 A1* | 7/2006 | Tamada .................. | G11C 16/26 365/185.2 |
| 2010/0020608 A1* | 1/2010 | Kamigaichi .......... | G11C 5/025 365/185.05 |
| 2010/0090286 A1* | 4/2010 | Lee .................... | H01L 27/11526 257/368 |
| 2010/0117143 A1* | 5/2010 | Lee ...................... | H01L 27/0688 257/329 |
| 2011/0121403 A1* | 5/2011 | Lee .................... | H01L 27/11526 257/390 |
| 2011/0175159 A1* | 7/2011 | Itagaki ..................... | G11C 5/02 257/326 |
| 2011/0176364 A1* | 7/2011 | Ogawa ................ | G11C 11/5635 365/185.12 |

(Continued)

*Primary Examiner* — Viet Q Nguyen
(74) *Attorney, Agent, or Firm* — Patterson & Sheridan, LLP

(57) ABSTRACT

A semiconductor memory device includes a first block of memory cells that includes a first word line above a substrate, a second word line above the first word line, and a third word line above the second word line, a first control line electrically connected to the first word line, a second control line electrically connected to the second word and between the first control line and the first block, and a third control line electrically connected to the third word line and between the second control line and the first block.

19 Claims, 11 Drawing Sheets

(56) References Cited

U.S. PATENT DOCUMENTS

2013/0250683 A1* 9/2013 Hosono .............. G11C 16/0483
365/185.05

* cited by examiner

SEMICONDUCTOR MEMORY DEVICE

CROSS-REFERENCE TO RELATED APPLICATION

This application is based upon and claims the benefit of priority from Japanese Patent Application No. 2015-049994, filed Mar. 12, 2015, the entire contents of which are incorporated herein by reference.

FIELD

Embodiments described herein relate generally to a semiconductor memory device.

BACKGROUND

A NAND-type flash memory in which memory cells are three-dimensionally arranged is known.

DETAILED DESCRIPTION

Figure 1:
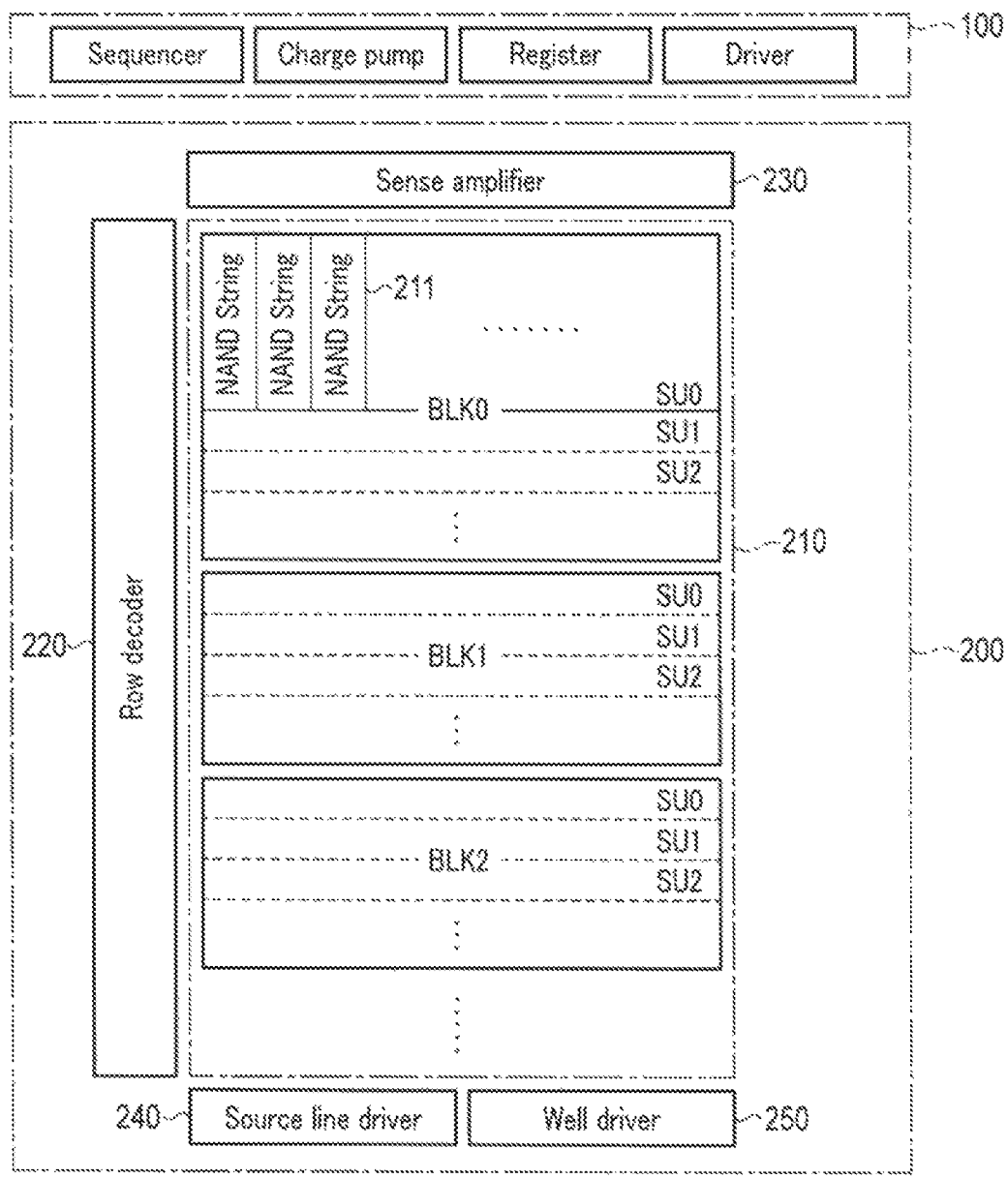
FIG. 1 is a block diagram which shows a semiconductor memory device according to a first embodiment.

Embodiments provide a semiconductor memory device which reduces variations in memory cell operations carried out therein.

According to embodiments, a semiconductor memory device includes a first block of memory cells that includes a first word line above a substrate, a second word line above the first word line, and a third word line above the second word line, a first control line electrically connected to the first word line, a second control line electrically connected to the second word line and between the first control line and the first block, and a third control line electrically connected to the third word line and between the second control line and the first block.

The embodiment will be described with reference to the drawings. In the drawings, the same portion will be denoted by the same reference numeral.

First Embodiment

A semiconductor memory device according to a first embodiment will be described using FIGS. 1 to 13. In this embodiment, a three-dimensionally stacked NAND-type flash memory will be described as an example of the semiconductor memory device.

As shown in FIG. 1, a semiconductor memory device (NAND-type flash memory) includes a core portion 200 and a peripheral circuit 100.

The core portion 200 includes a memory cell array 210, a row decoder 220, a sense amplifier 230, a source line driver 240, and a well driver 250.

The memory cell array 210 includes a plurality of blocks BLK (BLK0, BLK1, BLK2, . . . ). Each block BLK is a set of non-volatile memory cells. Each of the non-volatile memory cells is located at an intersection of a word line and a bit line. The block BLK is a unit of data erasure, such that data in the same block BLK are collectively erased. Each block BLK includes a plurality of string units (SU0, SU1, SU2, . . . ). Each string unit SU includes a set of NAND strings 211 in each of which memory cells are connected to each other in series. The number of blocks in the memory cell array 210 and the number of string units in the block BLK are arbitrary.

However, erasing data in the block BLK need not be collectively performed, but may be performed in units smaller than a block, for example, a half block (HBL) unit. A case where data are erased in units smaller than a block is described in U.S. patent application Ser. No. 13/235,389, filed on Sep. 18, 2011, entitled "Nonvolatile semiconductor memory device," and in U.S. patent application Ser. No. 12/694,690, filed on Jan. 27, 2010, entitled "Non-volatile semiconductor memory device." The entire contents of these patent applications are incorporated by reference herein.

The row decoder 220 decodes a block address or a page address and selects a word line of a corresponding block BLK. Then, the row decoder 220 applies an appropriate voltage to the selected word line and non-selected word lines. The details of the row decoder 220 will be described later.

During a read operation, the sense amplifier 230 senses data stored in a memory cell through a bit line. In addition, during a write operation, the sense amplifier 230 transfers write data to the memory cell through the bit line.

The source line driver 240 applies a voltage to a source line.

The well driver 250 applies a voltage to a well region in which the NAND string 211 is formed.

The peripheral circuit 100 includes a sequencer 110, a charge pump 120, a register 130, and a driver 140.

The sequencer 110 controls an entire operation of a NAND-type flash memory.

The charge pump 120 boosts a power supply voltage supplied from the outside, and supplies a necessary voltage to the driver 140.

The driver 140 supplies a voltage necessary for writing, reading, and erasing data to the row decoder 220, the sense amplifier 230, the source line driver 240, and the well driver 250.

The register 130 holds various signals. For example, the register informs a controller (not shown) whether or not an operation has normally completed by storing a status of a write or an erase operation of data. In addition, the register 130 may store various tables.

Figure 2:
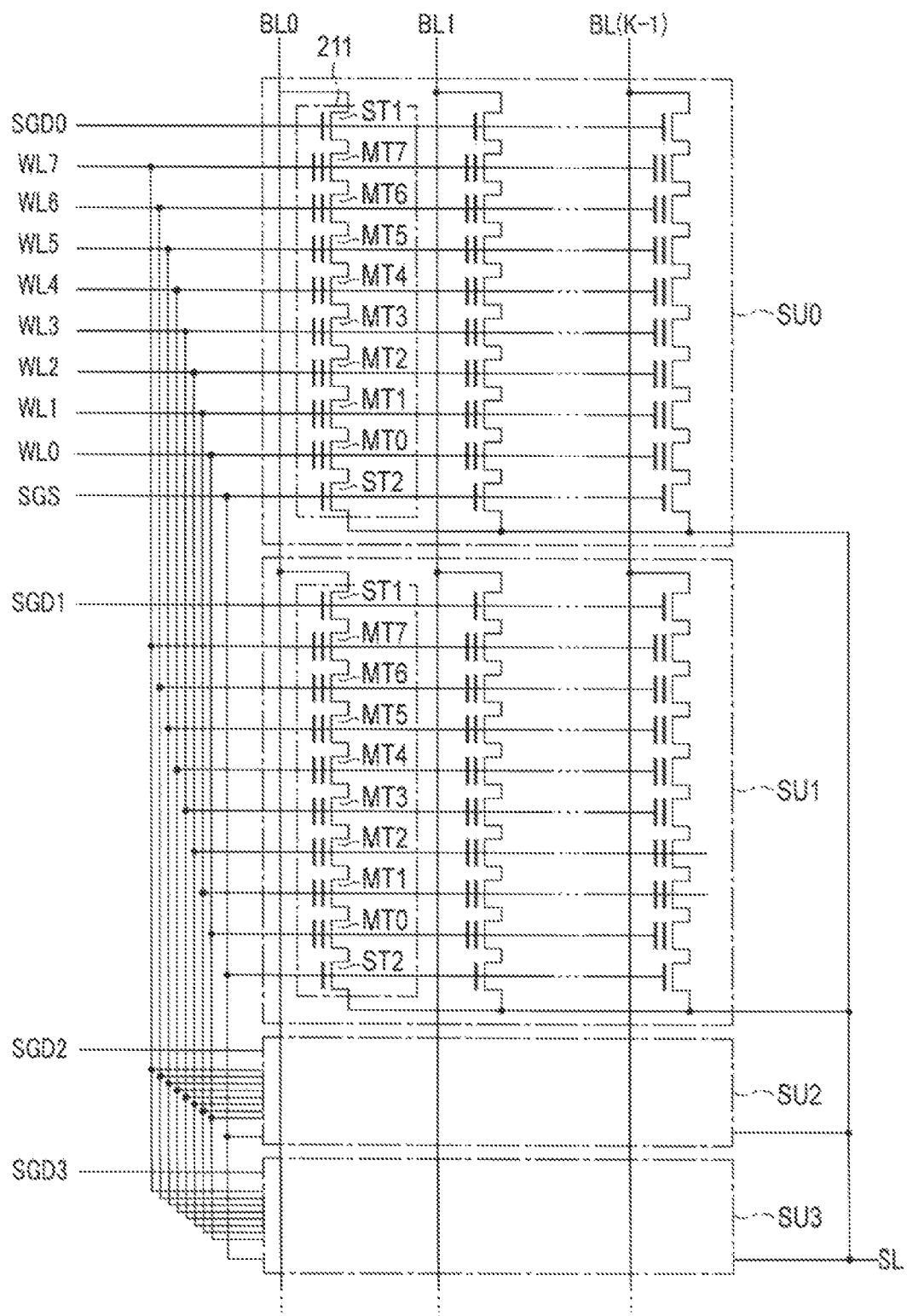
FIG. 2 is a circuit diagram which shows a memory cell array of the semiconductor memory device according to the first embodiment.

FIG. 2 is a circuit diagram of one block BLK.

As shown in FIG. 2, the block BLK includes, for example, four string units SU (SU0 to SU3). Moreover, each string unit SU includes a plurality of NAND strings 211.

Each of the NAND strings 211 includes, for example, eight memory cell transistors MT (MT0 to MT7), and select transistors ST1 and ST2. The memory cell transistor MT includes a stacked gate having a control gate and a charge storage layer, and stores data in a non-volatile manner. The number of the memory cell transistors MT is not limited to eight, and may be 16, 32, 64, 128, and the like. This number may be any number. The memory cell transistors MT0 to MT7 have current paths formed in series. One end of the memory cell transistor MT7 on one end side is connected to one end of the select transistor ST1, and one end of the memory cell transistor MT0 on the other end side is connected to one end of the select transistor ST2.

Each gate of the select transistor ST1 of the NAND strings in one string unit (SU0, SU1, SU2, or SU3) is commonly connected to one of the select gate lines SGD0 to SGD3. On the other hand, a gate of the select transistor ST2 of the NAND strings in all string units (SU0, SU1, SU2, and SU3) is commonly connected to the same select gate line SGS. In addition, the control gates of the memory cell transistors MT0 to MT7 in the same block BLK are commonly connected to the word lines WL0 to WL7, respectively.

In other words, the word lines WL0 to WL7 and the select gate line SGS are commonly connected across the plurality of string units SU0 to SU3 in the same block BLK. On the other hand, the select gate line SGD is independent for each of the string units SU0 to SU3, even within the same block BLK.

Moreover, among the NAND strings 211 arranged in a matrix form in the memory cell array 210, the other end of the select transistor ST1 of the NAND strings 211 in the same row is commonly connected to one of bit lines BL (BL0 to BL(K−1), wherein (K−1) is a natural number of 1 or more). That is, the bit line BL connects the NAND strings 211 across the plurality of string units SUs. In addition, the other end of the select transistor ST2 is commonly connected to a source line SL. The source line SL commonly connects the NAND strings 211, for example, across the plurality of blocks.

A gate of the select transistor ST1 of each of the string units SU0 to SU3 is commonly connected to one of the select gate lines SGD0 to SGD3. On the other hand, a gate of the select transistor ST2 is commonly connected to the same select gate line SGS across the plurality of string units. In addition, control gates of the memory cell transistors MT0 to MT5 in the same block are commonly connected to the word lines WL0 to WL5, respectively.

That is, while the word lines WL0 to WL5 and the select gate line SGS are commonly connected across the plurality of string units SU0 to SU3 in the same block BLK, the select gate lines SGD0 to SGD3 are independent for each of the string units SU0 to SU3 even within the same block.

Data of the memory cell transistor MT in the same block are, for example, collectively erased. In contrast, reading and writing of data are collectively performed with respect to a plurality of memory cell transistors MT of one finger FNG of one block and are commonly connected to one word line. This unit of reading and writing data is referred to as a "page".

Figure 3:
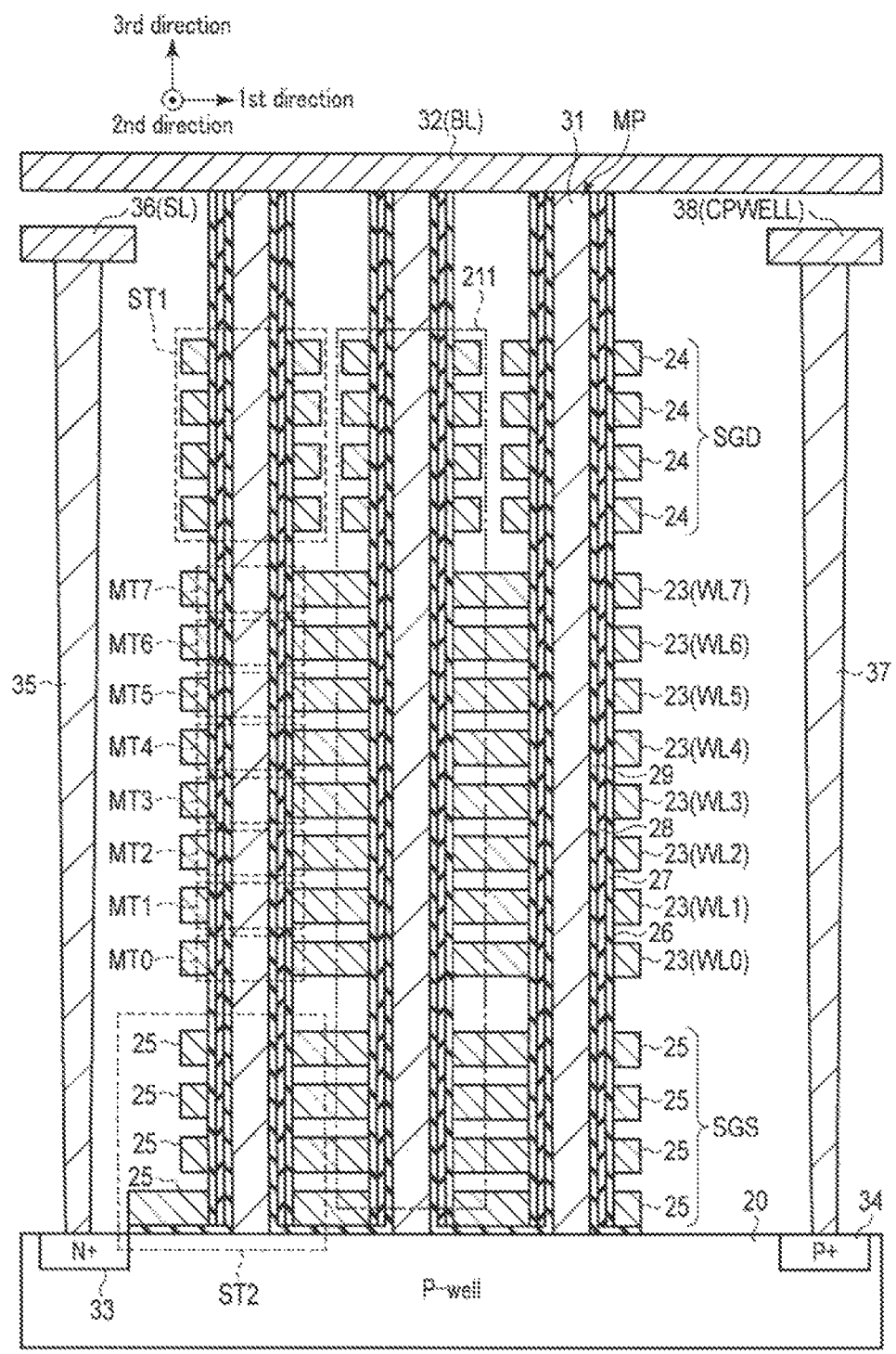
FIG. 3 is a sectional view which shows the memory cell array of the semiconductor memory device according to the first embodiment.

As shown in FIG. 3, a plurality of NAND strings 211 are provided above a p-type well region 20 of a semiconductor substrate.

More specifically, a memory pillar MP extends in a third direction (stacking direction) on the p-type well region 20. The memory pillar MP includes a semiconductor layer 31, a tunnel insulation layer 29, a charge storage layer 28, and a block insulation layer 27. The semiconductor layer 31 functions as a current path of the NAND string 211, and forms a channel during an operation of the memory cell transistor MT and the select transistor ST. The tunnel insulation layer 29, the charge storage layer 28, and the block insulation layer 27 are sequentially provided so as to cover a periphery of the semiconductor layer 31. A plurality of wiring layers 25, a plurality of wiring layers 23, and a plurality of wiring layers 24 are sequentially provided from a lower side in the third direction so as to cover a periphery of the block insulation layer 27.

The wiring layer 25 functions as the select gate line SGS, the wiring layer 23 functions as the word line WL, and the wiring layer 24 functions as the select gate line SGD. The select gate line SGD extends in a second direction (paper depth direction).

The select transistor ST2 includes a memory pillar MP and the wiring layer 25. The memory cell transistor MT includes the memory pillar MP and the wiring layer 23. The select transistor ST1 includes the memory pillar MP and the wiring layer 24.

Here, a plurality (four layers in the example) of wiring layers 25 are electrically connected to the same select gate line SGS in a common manner. That is, this four layered wiring layers 25 substantially function as a gate electrode of one select transistor ST2. This is also the same as in the select transistor ST1 (four layered select gate line SGD).

With the above configuration, the select transistor ST2, the memory cell transistor MT, and the select transistor ST1 are sequentially stacked on the well region 20 in each NAND string 211. A string unit SU includes a plurality of NAND strings 211 arranged in the second direction.

A wiring layer 32 which functions as the bit line BL is provided at an upper end of the memory pillar MP. The bit line BL extends in a first direction (paper left-right direction), and is connected to the sense amplifier 230.

Furthermore, an $N^+$-type impurity diffusion layer 33 and a $P^+$-type impurity diffusion layer 34 are provided on a surface of the p-type well region 20. A contact plug 35 is provided on the $N^+$-type impurity diffusion layer 33, and a wiring layer 36 functioning as a source line SL is provided on the contact plug 35. The source line SL is connected to the source line driver 240. In addition, a contact plug 37 is provided on the $P^+$-type impurity diffusion layer 34, and a wiring layer 38 functioning as a well wiring CPWELL is provided on the contact plug 37. The well wiring CPWELL is connected to the well driver 250. The wiring layers 36 and 38 are upper layers above the select gate line SGD, and are formed below the wiring layer 32.

In addition, a gate insulation layer (tunnel insulation layer 29) is formed between the p-type well region 20 and the lowest layer of wiring layer 25, and the lowest layer of wiring layer 25 and the gate insulation layer are formed out to an edge of the $N^+$-type impurity diffusion layer 33. Therefore, when the select transistor ST2 is turned on, a channel is formed not only in the semiconductor layer 31 but also on a surface of the well region 20. That is, the select transistor ST2 at upper layers of wiring layer 25 and the diffusion layer 33 are electrically connected by the select transistor ST2 at the lowest layer of wiring layer 25. Accordingly, a voltage is applied to the diffusion layer 33 (source line SL), whereby it is possible to apply a potential to a channel of the semiconductor layer 31. It is also possible to apply a potential to a channel of the semiconductor layer 31 by applying a voltage to the well region 20.

The memory cell array 210 may be configured in other ways. Other such configurations of the memory cell array 210 are described in U.S. patent application Ser. No. 14/007,403, filed on Mar. 19, 2009, entitled "Three-dimensional stacked non-volatile semiconductor memory," U.S. patent application Ser. No. 14/006,524, filed on Mar. 18, 2009, entitled "Three dimensional stacked non-volatile semiconductor memory," U.S. patent application Ser. No. 12/679,991, filed on Mar. 25, 2010, entitled "Non-volatile semiconductor memory device and method of manufacturing the same," and U.S. patent application Ser. No. 12/532,030, filed on Mar. 23, 2009, entitled "Semiconductor memory and method of manufacturing the same." The entire contents of these patent applications are incorporated herein by reference.

Figure 4:
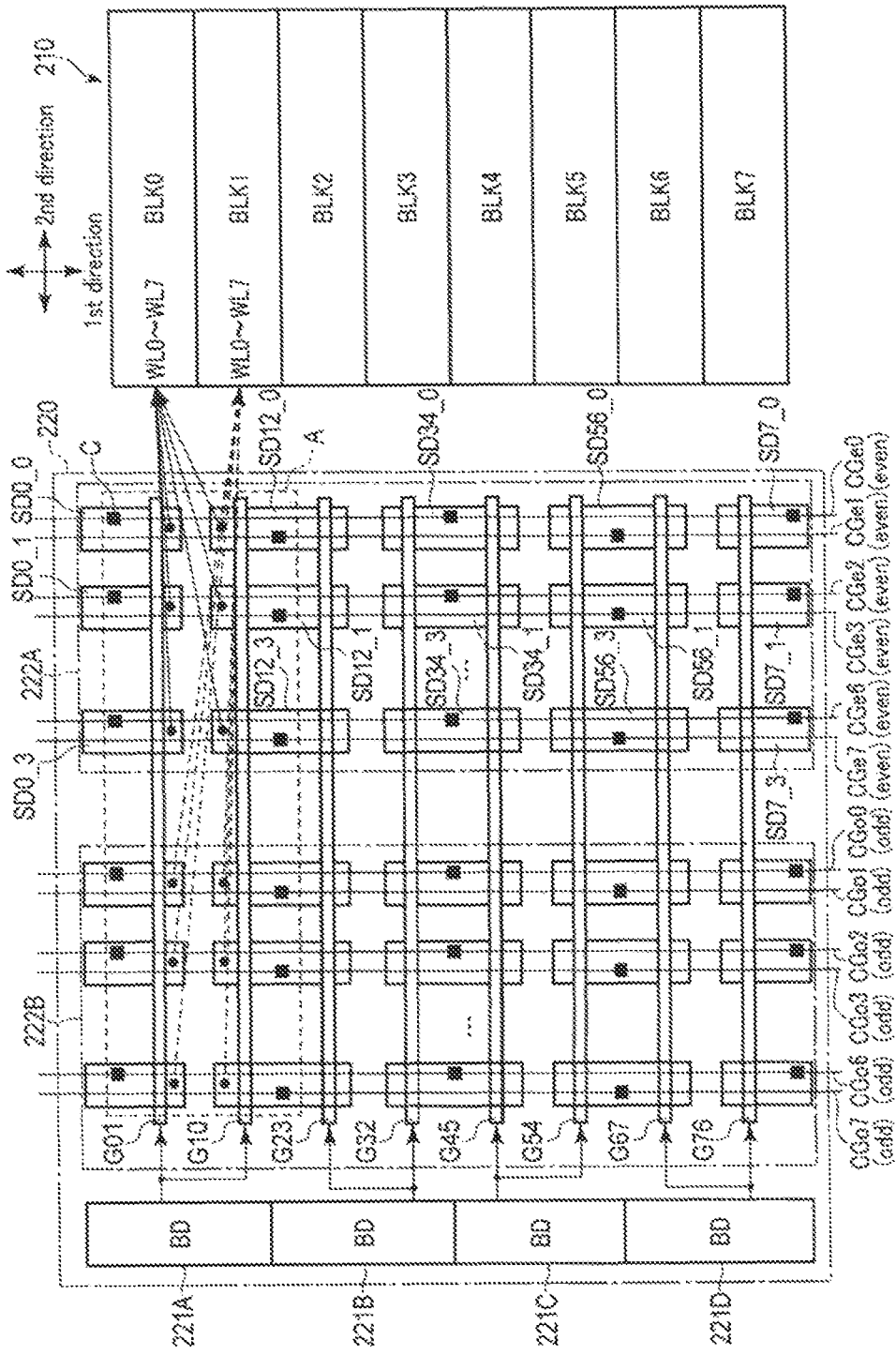
FIG. 4 is a layout diagram which shows a row decoder of the semiconductor memory device according to the first embodiment.

FIG. 4 shows a configuration example of a row decoder in the first embodiment

In the same manner as in FIGS. 2 and 3, a case of having eight word lines WL0 to WL7 will be described in FIG. 4. Moreover, eight blocks BLK0 to BLK7 in the memory cell array 210 are shown herein.

As shown in FIG. 4, the row decoder 220 includes word line switch arrays 222A and 222B, and block decoders 221A, 221B, 221C, and 221D.

The word line switch array 222A is for an even numbered block and is arranged next to the memory cell array 210 in the second direction. The word line switch array 222B is for an odd numbered block and is arranged next to the word line switch array 222A in the second direction. The word line switch array 222A is arranged between the memory cell array 210 and the word line switch array 222B in the second direction. The block decoders 221A, 221B, 221C, and 221D are arranged next to the word line switch array 222B in the second direction. The word line switch array 222B is arranged between the block decoders 221A, 221B, 221C, and 221D and the word line switch array 222A. In addition, the block decoders 221A, 221B, 221C, and 221D are arranged at the same position in the second direction and are sequentially arranged in the first direction.

The word line switch array 222A connects a word line WL for an even numbered block BLK to a control gate line CG for an even numbered block BLK. On the other hand, the word line switch array 222B connects a word line WL for an odd numbered block BLK to a control gate line CG for an odd numbered block BLK.

As depicted within a broken line section A of FIG. 4, the word line switch array 222A includes diffusion layer regions SD0_0 to SD0_3, diffusion layer regions SD12_0 to SD12_3, and gate electrodes G01 and G10.

The diffusion layer regions SD0_0 to SD0_3 are arranged in the second direction, and the diffusion layer regions SD12_0 to SD12_3 are arranged in the second direction. Moreover, diffusion layer regions SD0_0 to SD0_3 and diffusion layer regions SD12_0 to SD12_3 are respectively arranged in the first direction. The gate electrode G01 extending in the second direction is provided on the diffusion layer regions SD0_0 to SD0_3, and the gate electrode G10 extending in the second direction is provided on the diffusion layer regions SD12_0 to SD12_3.

Control gate lines CGe0 to CGe7 for an even numbered block BLK extending in the first direction are provided above the word line switch array 222A. More specifically, control gate lines CGe0 and CGe1 are provided above the diffusion layer regions SD0_0 and SD12_0 of the word line switch array 222A, and control gate lines CGe2 and CGe3 are provided above diffusion layer regions SD0_1 and SD12_1, control gate lines CGe4 and CGe5 (not shown) are provided above diffusion layer regions SD0_2 and SD12_2 (not shown), and control gate lines CGe6 and CGe7 are provided above diffusion layer regions SD0_3 and SD12_3.

Each of the control gate lines CGe0, CGe2, CGe4, and CGe6 for an even numbered block BLK is electrically connected to one side (source) of the diffusion layer regions SD0_0 to SD0_3, respectively, through a contact C. In addition, each of the control gate lines CGe1, CGe3, CGe5, and CGe7 for an even numbered block BLK is electrically connected to one side (source) of the diffusion layer regions SD12_0 to SD12_3, respectively, through a contact C. In addition, word lines WL0 to WL7 of a block BLK0 are electrically connected to the other side (drain) of the diffusion layer regions SD0_0 to SD0_3 and SD12_0 to SD12_3, respectively.

Figure 5:
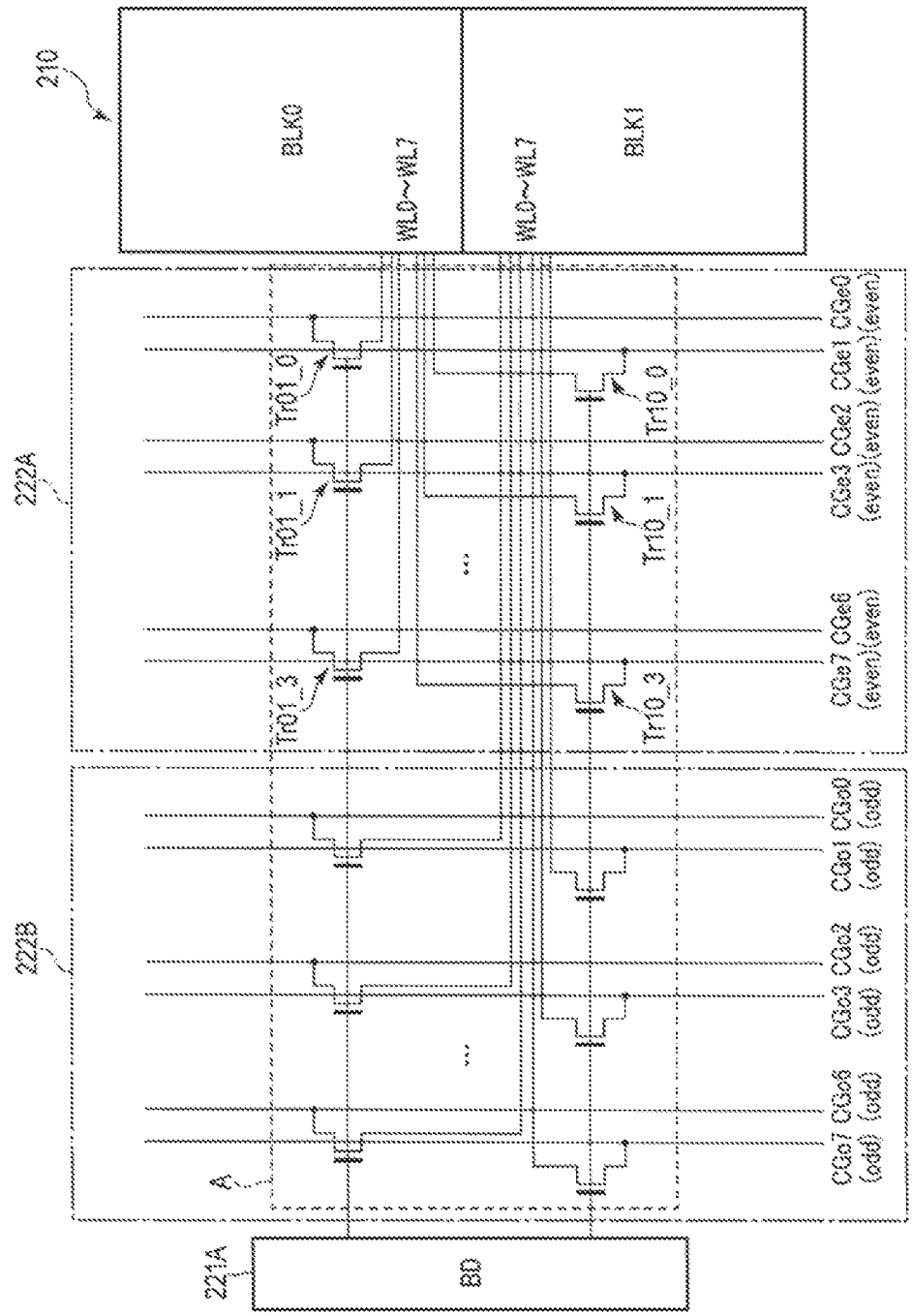
FIG. 5 is a circuit diagram of a broken line section A in FIG. 4

As shown in FIG. 5, transfer transistors Tr01_0 to Tr01_3 include the diffusion layer regions SD0_0 to SD0_3 and the gate electrode G01. In addition, transfer transistors Tr10_0 to Tr10_3 include the diffusion layer regions SD12_0 to SD12_3 and the gate electrode G10. The transfer transistors Tr01_0 to Tr01_3 transfer a voltage to the word lines WL from the control gate lines CGe0, CGe2, CGe4, and CGe6, respectively. Moreover, the transfer transistors Tr10_0 to Tr10_3 transfer a voltage to the word lines WL from the control gate lines CGe1, CGe3, CGe5, and CGe7, respectively.

That is, each of one ends of the transfer transistors Tr01_0 to Tr01_3 is connected to a corresponding one of the control gate lines CGe0, CGe2, CGe4, and CGe6, and each of the other ends thereof is electrically connected to one of the word lines WL of the block BLK0. In addition, each of one ends of the transfer transistors Tr10_0 to Tr10_3 is connected to a corresponding one of the control gate lines CGe1, CGe3, CGe5, and CGe7, respectively, and each of the other ends thereof is electrically connected to one of the word lines WL of the block BLK0.

Connections between the word lines WL0 to WL7 and the control gate lines CGe0 to CGe7 will be described in detail below.

As shown in the broken line section A of FIG. 4, the word line switch array 222B has the same configuration as the word line switch array 222A.

The gate electrode G01 is also provided on the diffusion layer regions SD0_0 to SD0_3 of the word line switch array 222B, and the gate electrode G10 is also provided on the diffusion layer regions SD12_0 to SD12_3 of the word line switch array 222B.

Control gate lines CGo0 to CGo7 for an odd numbered block BLK extending in the first direction are provided above the word line switch array 222B.

Each of control gate lines CGo0, CGo2, CGo4, and CGo6 for an odd numbered block BLK is electrically connected to one side (source) of the diffusion layer regions SD0_0 to SD0_3, respectively, through a contact C. In addition, each of control gate lines CGo1, CGo3, CGo5, and CGo7 for an odd numbered block BLK is electrically connected to one side (source) of the diffusion layer regions SD12_0 to SD12_3, respectively, through a contact C. In addition, word lines WL0 to WL7 of a block BLK1 are electrically connected to the other side (drain) of the diffusion layer regions SD0_0 to SD0_3, and SD12_0 to SD12_3, respectively.

In this manner, a voltage is transferred to the word lines WL0 to WL7 of the block BLK0 by diffusion layer regions SD0_0 to SD0_3 and SD12_0 to SD12_3 of the word line switch array 222A, and gate electrodes G01 and G10. In addition, a voltage is transferred to the word lines WL0 to WL7 of the block BLK1 by diffusion layer region SD0_0 to SD0_3 and SD12_0 to SD12_3 of the word line switch array 222B, and the gate electrodes G01 and G10.

Moreover, two gate electrodes G are arranged on one diffusion layer region SD, and thereby two transfer transistors Tr adjacent in the first direction are configured. In other words, two transfer transistors Tr adjacent in the first direction share one diffusion layer region SD.

Accordingly, in the same manner as described above, a voltage is transferred to word lines WL0 to WL7 of a block BLK2 by diffusion layer regions SD34_0 to SD34_3 and SD12_0 to SD12_3 of the word line switch array 222A, and gate electrodes G32 and G23. In addition, a voltage is transferred to word lines WL0 to WL7 of a block BLK3 by diffusion layer regions SD34_0 to SD34_3 and SD12_0 to SD12_3 of the word line switch array 222B, and the gate electrodes G32 and G23.

In addition, a voltage is transferred to word lines WL0 to WL7 of a block BLK4 by diffusion layer regions SD34_0 to SD34_3 and SD56_0 to SD56_3 of the word line switch array 222A, and gate electrodes G45 and G54. In addition, a voltage is transferred to word lines WL0 to WL7 of a block BLK5 by diffusion layer regions SD34_0 to SD34_3 and SD56_0 to SD56_3 of the word line switch array 222B, and the gate electrodes G45 and G54.

Furthermore, a voltage is transferred to word lines WL0 to WL7 of a block BLK6 by diffusion layer regions SD7_0 to SD7_3 and SD56_0 to SD56_3 of the word line switch array 222A, and gate electrodes G76 and G67. In addition, a voltage is transferred to word lines WL0 to WL7 of a block BLK7 by diffusion layer regions SD7_0 to SD7_3 and SD56_0 to SD56_3 of the word line switch array 222B, and the gate electrodes G76 and G67.

The block decoder 221A is commonly connected to two gate electrodes G01 and G10, and applies the same voltage thereto. That is, the block decoder 221A selects two blocks BLK0 and BLK1 at the same time. At this time, different voltages are applied to control gate lines CGe and CGo, respectively, and thereby one block BLK is selected and the other block BLK is non-selected. For example, in an erase operation, a voltage VISO is applied to a control gate line CGe, and thereby the block BLK0 is selected. On the other hand, a voltage VERA (>VISO) is applied to a control gate line CGo, and thereby the selected block BLK1 is not selected. Accordingly, it is possible to erase only the memory cells of the block BLK0.

In the same manner, the block decoder 221B is commonly connected to two gate electrodes G23 and G32, and applies the same voltage thereto. That is, the block decoder 221B selects two blocks BLK2 and BLK3 at the same time.

In addition, the block decoder 221C is commonly connected to two gate electrodes G45 and G54, and applies the same voltage thereto. That is, the block decoder 221C selects two blocks BLK4 and BLK5 at the same time.

Moreover, the block decoder 221D is commonly connected to two gate electrodes G67 and G76, and applies the same voltage thereto. That is, the block decoder 221D selects two blocks BLK6 and BLK7 at the same time.

In the example described above, each block decoder 221 selects two blocks BLK, such that it is possible to select two blocks BLK using one address.

A connection relationship between the word line and the control gate line in the first embodiment.

Figure 6:
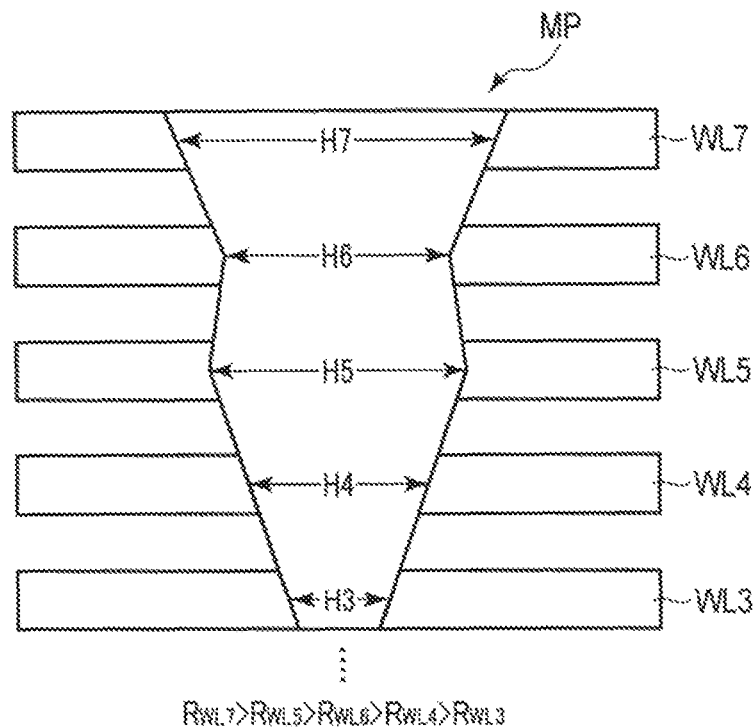
FIG. 6 is a sectional view which shows a portion of a memory pillar of the semiconductor memory device according to the first embodiment.

FIG. 6 shows word lines WL3 to WL7 of eight stacked word lines WL0 to WL7 of a NAND string.

As shown in FIG. 6, the memory pillar MP is provided in the word lines WL3 to WL7, and extends in a stacking direction. A diameter of the memory pillar MP decreases from a top layer (WL7) to a lower layer side. The diameter of the memory pillar MP is temporarily increased near a layer (for example, WL5) between the top layer and a bottom layer. Then, the diameter of the memory pillar MP is decreased again from that layer to the bottom layer (WL0). The average diameters H3 to H7 of the memory pillar MP corresponding to each of the word lines WL3 to WL7 have a relationship of H7>H5>H6>H4>H3.

For brevity, description is provided herein using five word lines WL, but the invention is not limited thereto. One or more word lines WL may be provided between two of the word lines WL shown in FIG. 6 (for example, between a word line WL7 and a word line WL6). In such an example, a diameter H of the memory pillar MP corresponding to the word line WL has a relationship of H7>H>H6.

Figure 7:
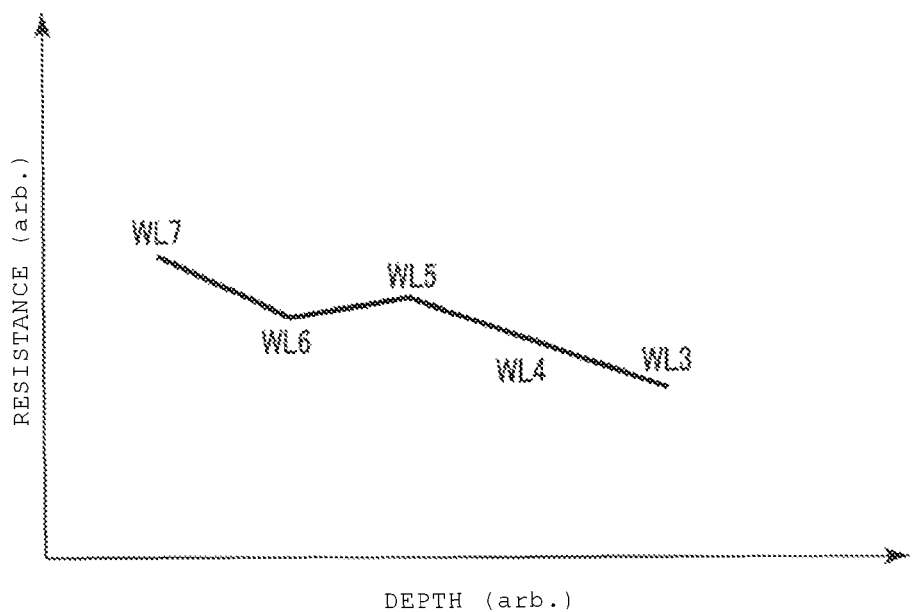
FIG. 7 is a graph which shows resistances of word lines in FIG. 6.

A resistance RWL of a word line is determined by a dimension (sectional area and the like) of the word line WL and a dimension (sectional area and the like, that is, a diameter H) of the memory pillar MP in the word line WL. That is, when the dimension of the memory pillar MP is increased, the resistance RWL is increased, and when the dimension of the memory pillar MP is decreased, the resistance RWL is decreased. Therefore, as shown in FIG. 7, resistances RWL3 to RWL7 of each of the word lines WL3 to WL7 have a relationship of RWL7>RWL5>RWL6>RWL4>RWL3.

Figure 8:
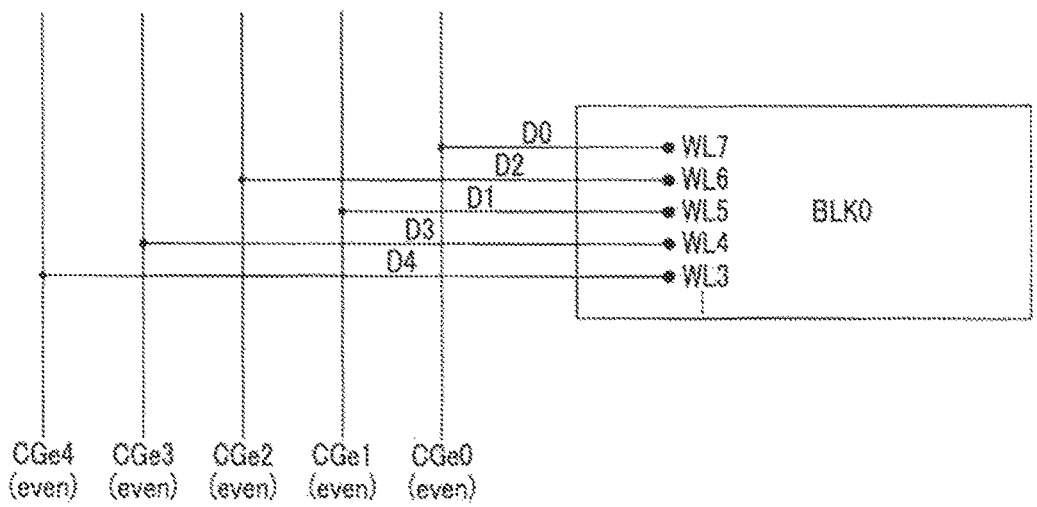
FIG. 8 is a diagram which shows a connection relationship between the word lines in FIG. 6 and control gate lines.

FIG. 8 shows a connection relationship between word lines WL3 to WL7 in an even numbered block BLK0 and control gate lines CGe0 to CGe4 for an even numbered block, but. It should be recognized that a connection relationship between word lines WL3 to WL7 in an odd numbered block BLK1 and control gate lines CGo0 to CGo4 for an odd numbered block would be similar to the connection relationship shown in FIG. 8.

As shown in FIG. 8, the control gate lines CGe0 to CGe4 are sequentially arranged from the block BLK0 side. In other words, a control gate line CGe0 is arranged next to the block BLK0, a control gate line CGe1 is arranged next to the control gate line CGe0, and a control gate line CGe4 is arranged next to a control gate line CGe3. The physical distances D0 to D4 between the control gate lines CGe0 to CGe4 and the block BLK0 have a relationship of D4>D3>D2>D1>D0. However, the wiring lengths between the control gate lines CGe0 to CGe4 and the block BLK0, represented as d0 to d4, have a relationship of d4>(d3=d2)>(d1=d0). A resistance RHU of a word line hookup (connection wiring between the control gate line CGe and the word line WL) of the control gate line CGe is determined by a length of the wiring, that is, a distance from the block BLK to the control gate line CGe. That is, when the distance is long, the resistance RHU is increased, and when the distance is short, the resistance is decreased. Therefore, resistances RHU0 to RHU5 of a word line hookup of each of the control gate lines CGe0 to CGe5 have a relationship of (RH5=RH4)>(RH3=RH2)>(RH1=RH0).

In the example, the word line WL and the control gate line CGe are connected so as to reduce variation in total resistance RTOTAL. The resistance RTOTAL is a sum of the resistance RWL and the resistance RHU (RTOTAL=RWL+RHU).

Accordingly, a control gate line CGe with a word line hookup of a small resistance RHU is electrically connected to a word line WL of a large resistance RWL. That is, a control gate line CGe with a short distance is electrically connected to the word line WL of a large resistance RWL. Specifically, the word line WL7 is connected to the control gate line CGe0, the word linen WL6 is connected to the control gate line CGe2, the word line WL5 is connected to the control gate line CGe1, the word line WL4 is connected to the control gate line CGe3, and the word line WL3 is connected to the control gate line CGe4.

Effects in the First Embodiment

According to the first embodiment described above, the word lines WL have different resistances RWL, respectively, in the same block BLK. In addition, the control gate lines CG have different distances from the block BLK. Accordingly, the word lines WL and the control gate lines CG are electrically connected, so that a word line WL which has relatively large word line resistance RWL is electrically connected to a control gate line CG which has a relatively short distance from the block BLK. On the other hand, the word line WL which has relatively large word line resistance RWL is electrically connected to the control gate line CG which has a relatively long distance from the block BLK. That is, the word line WL which has a large resistance RWL is connected to the control gate line CG which has a small resistance RHU. On the other hand, a word line WL which has a small resistance RWL is connected to a control gate line CG which has a large resistance RHU. Accordingly, it is possible to reduce the variations in total resistance RTOTAL between the word lines WL in the same block BLK. As a result, it is possible to reduce variations in operation speed between the word lines WL in the same block BLK.

Modification Example in the First Embodiment

Hereinafter, a modification example in the first embodiment will be described. In the modification example, differences from the first embodiment will be mainly described.

Modification Example 1 is an example in which the memory pillar MP having a different sectional structure (different diameter) is formed due to differences in the manufacturing process.

Figure 9:
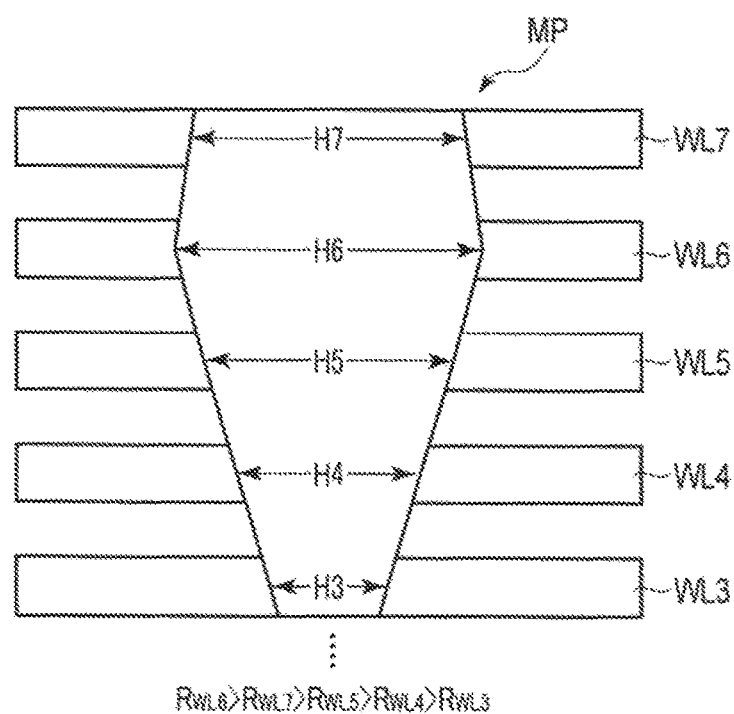
FIG. 9 is a sectional view which shows a portion of the memory pillar of a semiconductor memory device according to a first modification of the first embodiment.
Figure 10:
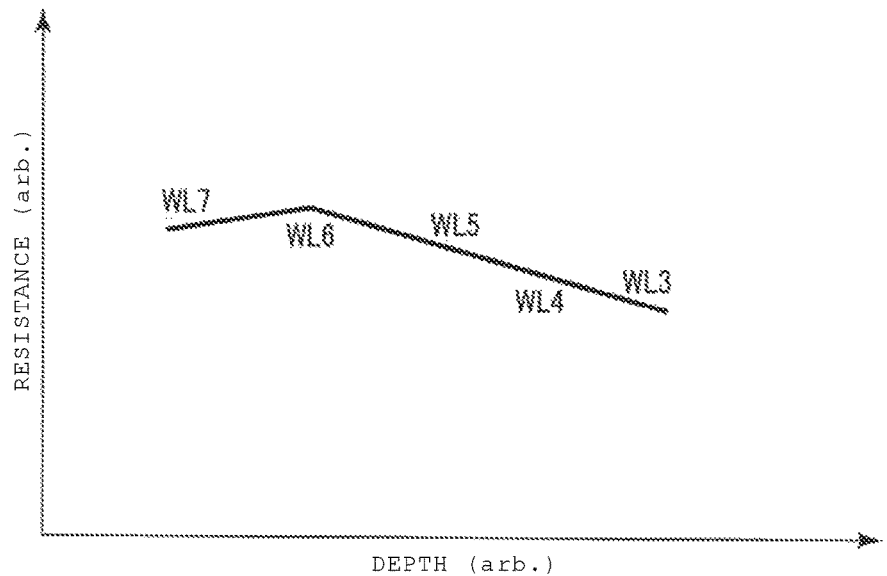
FIG. 10 is a graph which shows resistances of word lines in FIG. 9.

As shown in FIG. 9, the diameter of the memory pillar MP is increased from the top layer (WL7) to a layer (for example, WL6) between the top layer and the bottom layer due to the manufacturing process. Then, the diameter of the memory pillar MP is decreased from the layer (WL6) between the top layer and the bottom layer to the bottom layer (WL0). That is, average diameters H3 to H7 of the memory pillar MP corresponding to each of the word lines WL3 to WL7 have a relationship of H6>H7>H5>H4>H3. Therefore, as shown in FIG. 10, resistances RWL3 to RWL7 of each of the word lines WL3 to WL7 have a relationship of RWL6>RWL7>RWL5>RWL4>RWL3.

Figure 11:
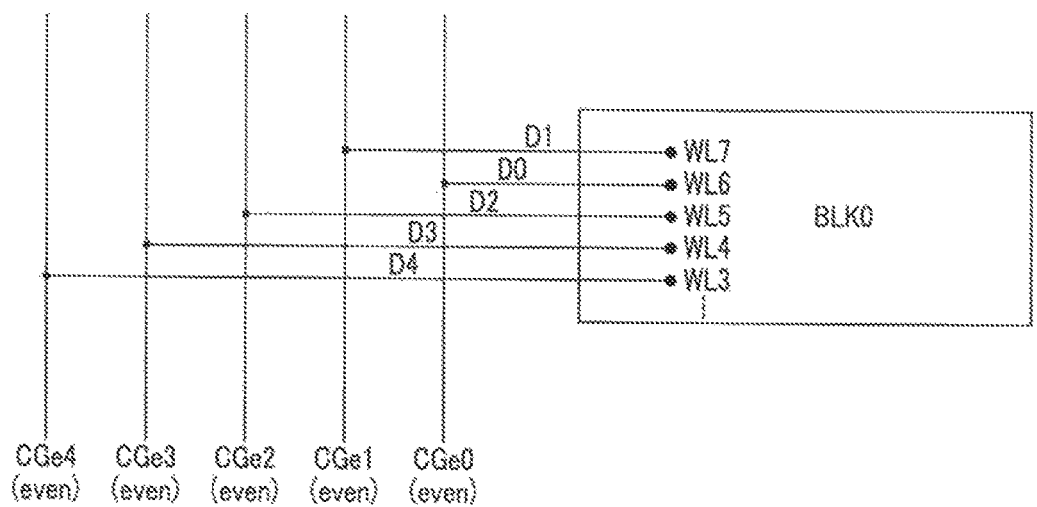
FIG. 11 is a diagram which shows a connection relationship between the word lines in FIG. 9 and control gate lines.

FIG. 11 shows a connection relationship between the word lines WL3 to WL7 in an even numbered block BLK0 and the control gate lines CGe0 to CGe4 for an even number. It should be recognized that a connection relationship between the word lines WL3 to WL7 in an odd numbered block BLK1 and control gate lines CGo0 to CGo4 for an odd number would be similar to the connection relationship shown in FIG. 11.

As shown in FIG. 11, a word line WL7 is connected to a control gate line CGe1, a word line WL6 is connected to a control gate line CGe0, a word line WL5 is connected to a control gate line CGe2, a word line WL4 is connected to a control gate line CGe3, and a word line WL3 is connected to a control gate line CGe4.

Accordingly, in the same manner as in the first embodiment, it is possible to reduce variations in total resistance RTOTAL between the word lines WL in the same block BLK. As a result, it is possible to reduce variations in operation speed between the word lines WL in the same block BLK.

Modification Example 2 is an example in which a memory pillar MP0 and a memory pillar MP1 are formed in two steps in a single NAND string. Effects on the process are the same as in the first embodiment.

Figure 12:
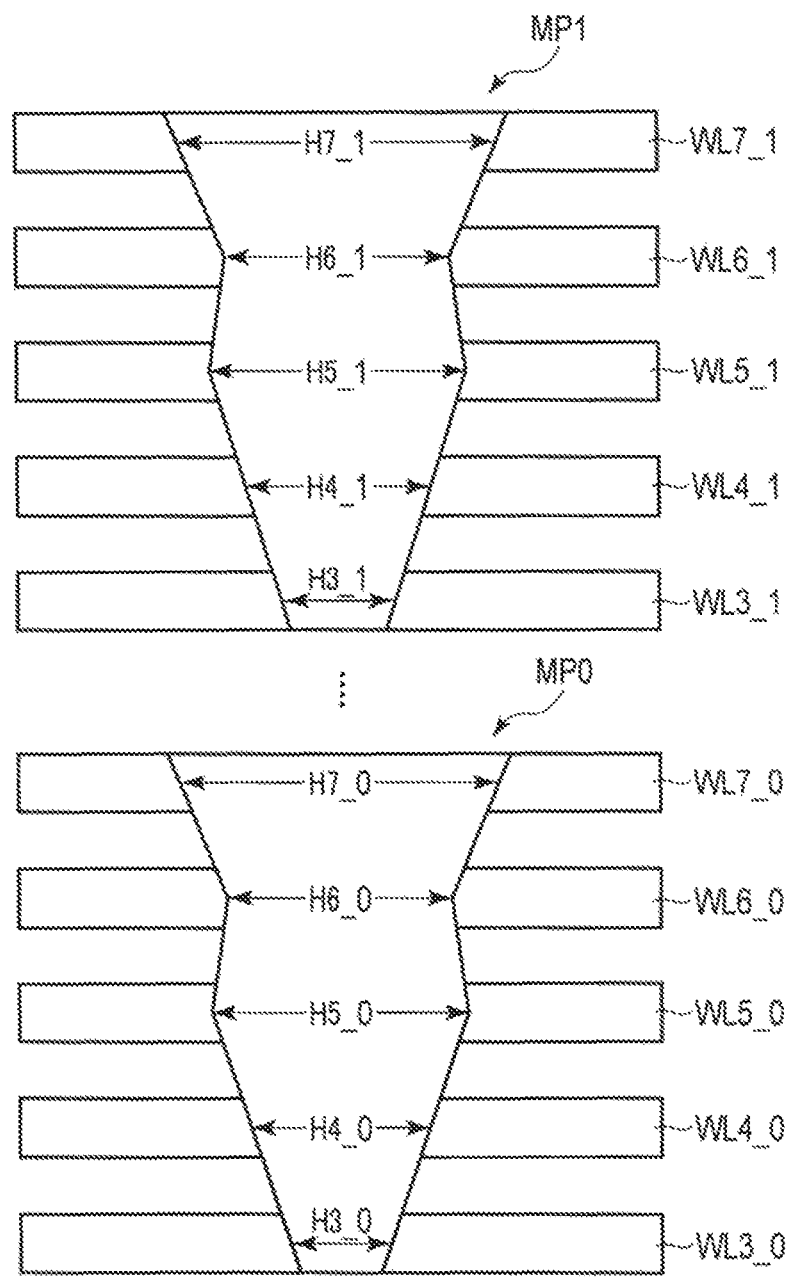
FIG. 12 is a sectional view which shows a portion of a memory pillar of a semiconductor memory device according to a second modification of the first embodiment.

As shown in FIG. 12, word lines WL0_0 to WL7_0 are sequentially stacked, and then a memory pillar MP0 is formed in the word lines in Modification Example 2. Furthermore, word lines WL0_1 to WL7_1 are sequentially stacked on the memory pillar MP0, and then a memory pillar MP1 is formed in the word lines. Accordingly, the memory pillar MP0 and the memory pillar MP1 have the same sectional structure (diameter). In addition, compared to the first embodiment, the number of the word lines WL is doubled.

Therefore, average diameters H3_0 to H7_0 of a memory pillar MP in each of the word lines WL3_0 to WL7_0, and average diameters H3_1 to H7_1 of the memory pillar MP in each of the word lines WL3_1 to WL7_1 have a relationship of H7_0=H7_1>H5_0=H5_1>H6_0=H6_1>H4_0=H4_1>H3_0=H3_1.

Figure 13:
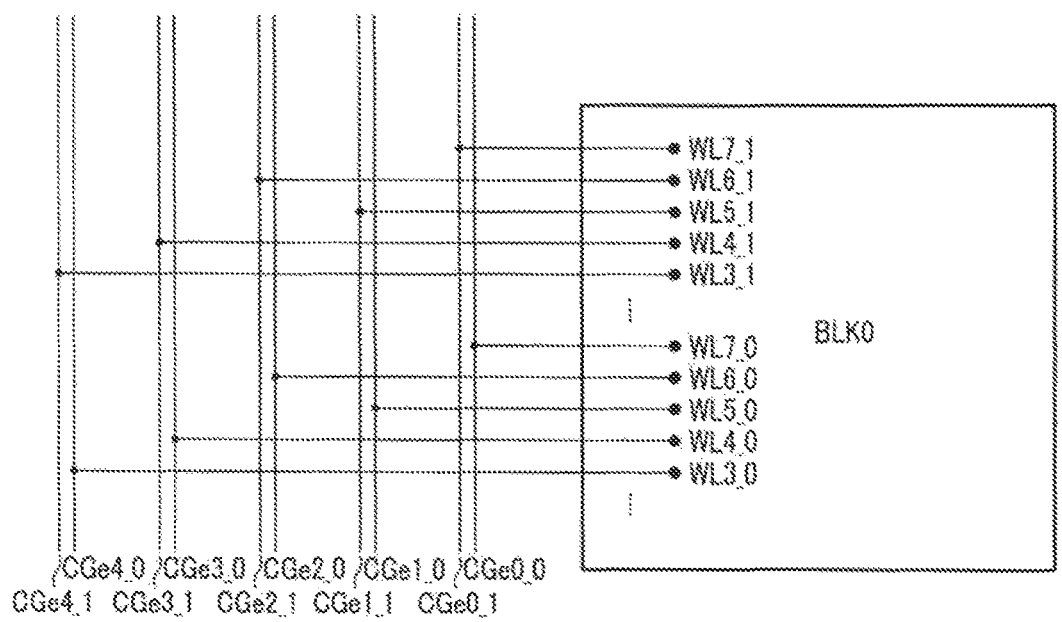
FIG. 13 is a diagram which shows a connection relationship between word lines in FIG. 12 and control gate lines.

As shown in FIG. 13, the control gate lines CGe0_0 and CGe0_1 to CGe4_0 and CGe4_1 are sequentially arranged from a block BLK side. Then, each of word lines WL7_0 to WL7_1 is connected to each of the control gate lines CGe0_0 and CGe0_1, each of word lines WL6_0 and WL6_1 is connected to each of the control gate lines CGe2_0 and CGe2_1, each of word lines WL5_0 and WL5_1 is connected to each of the control gate lines CGe1_0 and CGe1_1, each of word lines WL4_0 and WL4_1 is connected to each of the control gate lines CGe3_0 and CGe3_1, and each of word lines WL3_0 and WL3_1 is connected to each of the control gate lines CGe4_0 and CGe4_1.

Accordingly, in the same manner as in the first embodiment described above, it is possible to reduce variations in total resistance RTOTAL between the word lines WL in the same block BLK. As a result, it is possible to reduce variations in operation speed between the word lines WL in the same block BLK.

Second Embodiment

Using FIG. 14 below, a semiconductor memory device according to a second embodiment will be described. In the second embodiment, differences from the first embodiment will be mainly described.

Figure 14:
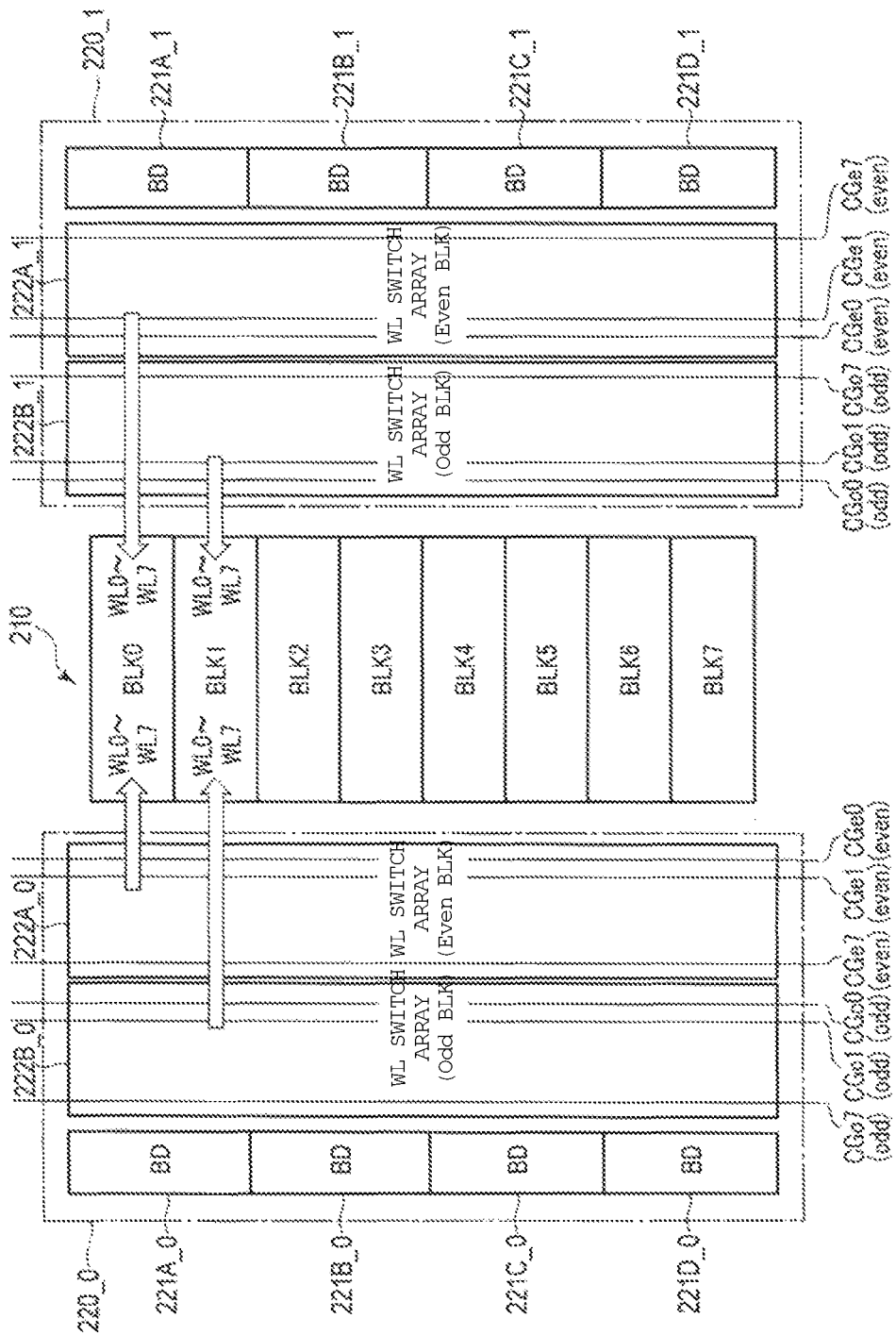
FIG. 14 is a layout diagram which shows a row decoder of a semiconductor memory device according to a second embodiment.

FIG. 14 shows a configuration example of a row decoder in the second embodiment.

In FIG. 14, a case of having eight word lines WL0 to WL7 will be described. In addition, eight blocks BLK0 to BLK7 in the memory cell array 210 are shown herein.

As shown in FIG. 14, a row decoder 220_0 is arranged on one side of the memory cell array 210, and a row decoder 220_1 is arranged on the other side.

The row decoder 220_0 includes word line switch arrays 222A_0 and 222B_0, and block decoders 221A_0, 221B_0, 221C_0, and 221D_0.

A word line switch array 222A_0 for an even number is arranged next to the memory cell array 210 in the second direction. A word line switch array 222B_0 for an odd number is arranged next to the word line switch array 222A_0 in the second direction. The word line switch array 222A_0 is arranged between the memory cell array 210 and the word line switch array 222B_0 in the second direction. The block decoders 221A_0, 221B_0, 221C_0, and 221D_0 are arranged next to the word line switch array 222B_0 in the second direction. The word line switch array 222B_0 is arranged between the block decoders 221A_0, 221B_0, 221C_0, and 221D_0 and the word line switch array 222A_0. In addition, the block decoders 221A_0, 221B_0, 221C_0, and 221D_0 are arranged at the same position in the second direction, and are sequentially arranged in the first direction.

The row decoder 220_1 includes the word line switch arrays 222A_1 and 222B_1, and the block decoders 221A_1, 221B_1, 221C_1, and 221D_1.

The word line switch array 222B_1 for an odd number is arranged next to the memory cell array 210 in the second direction. The word line switch array 222A_1 for an even number is arranged next to the word line switch array 222B_1 in the second direction. The word line switch array 222B_1 is arranged between the memory cell array 210 and the word line switch array 222A_1 in the second direction. The block decoders 221A_1, 221B_1, 221C_1, and 221D_1 are arranged next to the word line switch array 222A_1 in the second direction. The word line switch array 222A_1 is arranged between the block decoders 221A_1, 221B_1, 221C_1, and 221D_1 and the word line switch array 222B_1. In addition, the block decoders 221A_1, 221B_1, 221C_1, and 221D_1 are arranged at the same position in the second direction, and are sequentially arranged in the first direction.

That is, word line switch arrays 222A_0 and 222B_0 and word line switch arrays 222A_1 and 222B_1 are not mirror symmetric with respect to the memory cell array 210, but are arranged in the same order (when viewed left-to-right in FIG. 14) on opposite sides of the memory cell array 210.

The word line switch array 222A_0 connects each of word lines WL0 to WL7 of an even numbered block BLK to each of control gate lines CGe0 to CGe7 for an even numbered block BLK from one side. In addition, the word line switch array 222A_1 connects each of the word lines WL0 to WL7 of an even numbered block BLK to each of the control gate lines CGe0 to CGe7 for an even numbered block BLK from the other side.

Moreover, the word line switch array 222B_0 connects each of the word lines WL0 to WL7 of an odd numbered block BLK to each of the control gate lines CGo0 to CGo7 for an odd numbered block BLK from one side. In addition, the word line switch array 222B_1 connects each of the word lines WL0 to WL7 of an odd numbered block BLK to each of the control gate lines CGo0_CGo7 for an odd numbered block BLK from the other side.

That is, each word line WL of an even numbered block BLK is connected to a control gate line CGe which is close on one side (row decoder 220_0 side) and a control gate line CGe which is far on the other side (row decoder 220_1 side). In contrast, each word line WL of an odd numbered block BLK is connected to a control gate line CGo which is far on one side and a control gate line CGo which is close on the other side. Accordingly, even and odd blocks BLK have the same resistance WHU of word line hook up.

Effects in the Second Embodiment

According to the second embodiment, with respect to the memory cell array 210, the row decoder 220_0 is arranged on one side and the row decoder 220_1 is arranged on the other side. The row decoder 220_0 includes the word line switch array 222A_0 for an even numbered block and the word line switch array 222B_0 for an odd numbered block, and the word line switch array 222A_0 for an even numbered block and the word line switch array 222B_0 for an odd numbered block are sequentially arranged from the block BLK side. On the other hand, the row decoder 220_1 includes the word line switch array 222B_1 for an odd numbered block and the word line switch array 222A_1 for an even numbered block, and the word line switch array 222B_1 for an odd numbered block and the word line switch array 222A_1 for an even numbered block are sequentially arranged from the block BLK side.

Then, each word line WL of each even numbered block BLK is supplied with a voltage from the word line switch array 222A_0 which is relatively close on one side and the word line switch array 222A_1 which is relatively far on the other side. In addition, each word line WL of each odd numbered block BLK is supplied with a voltage from the word line switch array 222B_0 which is relatively far on one side and the word line switch array 222B_1 which is relatively close on the other side. Accordingly, it is possible to reduce variations in the resistance WHU of a word line hookup between an even numbered block BLK and an odd numbered block BLK. As a result, it is possible to reduce variations in operation speed between the even numbered block BLK and the odd numbered block BLK.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
  a first block of memory cells including a first word line above a substrate, a second word line above the first word line, and a third word line above the second word line;
  a first control gate line electrically connected to the first word line;
  a second control gate line electrically connected to the second word line and between the first control gate line and the first block;
  a third control gate line electrically connected to the third word line and between the second control gate line and the first block; and
  a fourth control gate line between the second and third control gate lines and electrically connected to a fourth word line that is between the first and second word lines.

2. The device according to claim 1, further comprising:
a fifth control gate line between the first and second control gate lines and electrically connected to a fifth word line that is between the first and fourth word lines.

3. The device according to claim 2, wherein
the first through fifth word lines have different resistances, the third word line having the highest resistance and the fourth word line having the second highest resistance.

4. A semiconductor memory device comprising:
a first block of memory cells including a first word line above a substrate, a second word line above the first word line, and a third word line above the second word line;
a first control gate line electrically connected to the first word line;
a second control gate line electrically connected to the second word line and between the first control gate line and the first block;
a third control gate line electrically connected to the third word line and between the second control gate line and the first block; and
a fourth control gate line between the second and third control gate lines and electrically connected to a fourth word line that is above the third word line.

5. The device according to claim 4, further comprising:
a fifth control gate line between the first and second control gate lines and electrically connected to a fifth word line that is between the first and second word lines.

6. The device according to claim 5, wherein
the first through fifth word lines have different resistances, the third word line having the highest resistance and the fourth word line having the second highest resistance.

7. The device according to claim 1, further comprising:
a first transfer transistor that is between the first word line and the first control gate line;
a second transfer transistor between the second word line and the second control gate line; and
a third transfer transistor between the third word line and the third control gate line.

8. A semiconductor memory device comprising:
a first block of memory cells including a first word line above a substrate, a second word line above the first word line, and a third word line above the second word line;
a first control gate line electrically connected to the first word line;
a second control gate line electrically connected to the second word line and between the first control gate line and the first block;
a third control gate line electrically connected to the third word line and between the second control gate line and the first block;
a second block of memory cells including a fourth word line electrically connected to the first word line and above the substrate, a fifth word line electrically connected to the second word line and above the fourth word line, and a sixth word line electrically connected to the third word line and above the fifth word line;
a fourth control gate line electrically connected to the fourth word line;
a fifth control gate line electrically connected to the fifth word line and between the fourth control gate line and the second block; and
a sixth control gate line electrically connected to the sixth word line and between the fifth control gate line and the second block.

9. A semiconductor memory device comprising:
a first block of memory cells including a first word line above a substrate, a second word line above the first word line, and a third word line above the second word line;
a first control gate line electrically connected to the first word line;
a second control gate line electrically connected to the second word line and between the first control gate line and the first block;
a third control gate line electrically connected to the third word line and between the second control gate line and the first block;
a fourth control gate line between the first and second control gate lines and electrically connected to a fourth word line that is between the first word line and the substrate;
a fifth control gate line between the second and third control gate lines and electrically connected to a fifth word line that is between the first and fourth word lines; and
a sixth control gate line between the third control gate line and the first block and electrically connected to a sixth word line that is between the first word line and the fifth word line.

10. The device according to claim 9, further comprising:
a fifth control gate line between the first and second control gate lines and electrically connected to a fifth word line that is between the first and fourth word lines.

11. The device according to claim 10, wherein
the first through fifth word lines have different resistances, the third word line having the highest resistance and the fourth word line having the second highest resistance.

12. A semiconductor memory device comprising:
a first block of memory cells including a first stack of word lines above a substrate;
a second block of memory cells including a second stack of word lines above the substrate;
a first set of control gate lines, each of which is electrically connected to one of the word lines of the second block;
a second set of control gate lines between the first set of control gate lines and the first and second blocks, each of the control gate lines of the second set being electrically connected to one of the word lines of the first block;
a third set of control gate lines, each of which is electrically connected to one of the word lines of the second block, wherein the first and second blocks are between the second and third sets of control gate lines; and
a fourth set of control gate lines, each of which is electrically connected to one of the word lines of the first block, wherein the third set of control gate lines is between the fourth set of control gate lines and the first and second blocks.

13. The device according to claim 12, wherein
each of the word lines in the first stack is electrically connected to one of the word lines in the second stack.

14. The device according to claim 12, wherein
the first stack of word lines includes a first word line above the substrate, a second word line above the first word line, and a third word line above the second word line; and
the second set of control gate lines includes a first control gate line electrically connected to the first word line, a second control gate line electrically connected to the second word line and between the first control gate line and the first and second blocks, and a third control gate line electrically connected to the third word line and between the second control gate line and the first and second blocks.

15. The device according to claim 14, wherein the second set of control gate lines further comprises:
   a fourth control gate line between the second and third control gate lines and electrically connected to a fourth word line that is between the first and second word lines; and
   a fifth control gate line between the first and second control gate lines and electrically connected to a fifth word line that is between the first and fourth word lines.

16. The device according to claim 15, wherein
   the first through fifth word lines have different resistances, the third word line having the highest resistance and the fourth word line having the second highest resistance.

17. The device according to claim 14, wherein the second set of control gate lines further comprises:
   a fourth control gate line between the second and third control gate lines and electrically connected to a fourth word line that is above the third word line; and
   a fifth control gate line between the first and second control gate lines and electrically connected to a fifth word line that is between the first and second word lines.

18. The device according to claim 17, wherein
   the first through fifth word lines have different resistances, the third word line having the highest resistance and the fourth word line having the second highest resistance.

19. The device according to claim 12, wherein
   each of the control gate lines is connected to one of the word lines through a transfer transistor.

* * * * *